United States Patent
Bao et al.

(10) Patent No.: US 12,438,045 B2
(45) Date of Patent: Oct. 7, 2025

(54) SEMICONDUCTOR STRUCTURE FORMATION

(71) Applicant: Taiwan Semiconductor Manufacturing Company Limited, Hsinchu (TW)

(72) Inventors: Zheng-En Bao, Tainan (TW); Po-Ju Chen, Hsinchu (TW); Chih-Teng Liao, Hsinchu (TW); Jiann-Horng Lin, Hsinchu (TW); Lin-Ting Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 769 days.

(21) Appl. No.: 17/653,782

(22) Filed: Mar. 7, 2022

(65) Prior Publication Data

US 2023/0282513 A1    Sep. 7, 2023

(51) Int. Cl.
*H01L 21/768* (2006.01)
*H01L 21/311* (2006.01)
*H01L 23/532* (2006.01)

(52) U.S. Cl.
CPC .. *H01L 21/76877* (2013.01); *H01L 21/31144* (2013.01); *H01L 21/76802* (2013.01); *H01L 21/7684* (2013.01); *H01L 21/76843* (2013.01); *H01L 23/53238* (2013.01)

(58) Field of Classification Search
None
See application file for complete search history.

(56) References Cited

U.S. PATENT DOCUMENTS

| | | | |
|---|---|---|---|
| 11,322,351 B2 | 5/2022 | Yu et al. | |
| 2017/0229390 A1* | 8/2017 | Chang | H01L 21/76846 |
| 2020/0144107 A1* | 5/2020 | Dutta | H01L 21/76816 |
| 2021/0017643 A1* | 1/2021 | Kanakasabapathy | |
| | | | C23C 16/045 |
| 2021/0313262 A1* | 10/2021 | Fu | H01L 21/76885 |
| 2022/0102268 A1* | 3/2022 | Alaan | H01L 23/53238 |

FOREIGN PATENT DOCUMENTS

TW    201842573 A    12/2018

* cited by examiner

*Primary Examiner* — Cory W Eskridge
(74) *Attorney, Agent, or Firm* — Harrity & Harrity, LLP

(57) ABSTRACT

A recovery layer (e.g., a layer of organic and/or tin-based material) is formed within recesses, in which adjacent MEOL or BEOL structures are formed, after plasma ashing and before a trimming process. The recovery layer preserves hardmask material and dielectric material such that upper surfaces of the adjacent MEOL or BEOL structures remain physically separated. As a result, the adjacent MEOL or BEOL remain electrically isolated and functional.

18 Claims, 17 Drawing Sheets

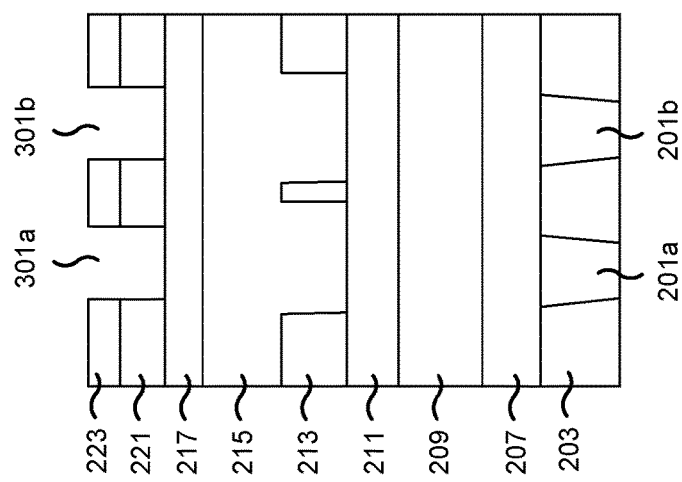

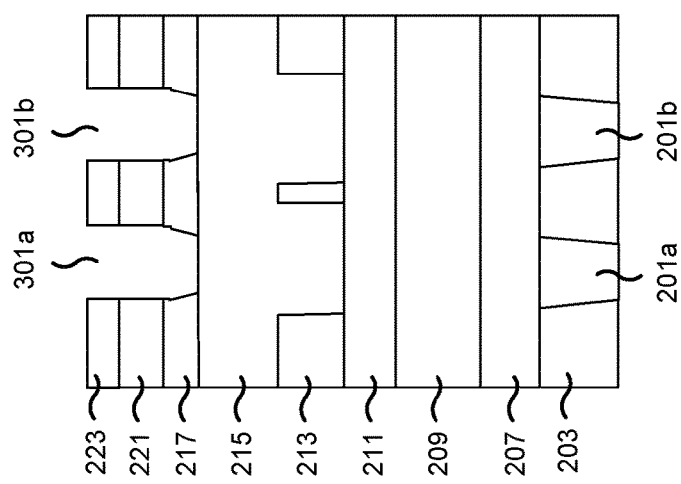

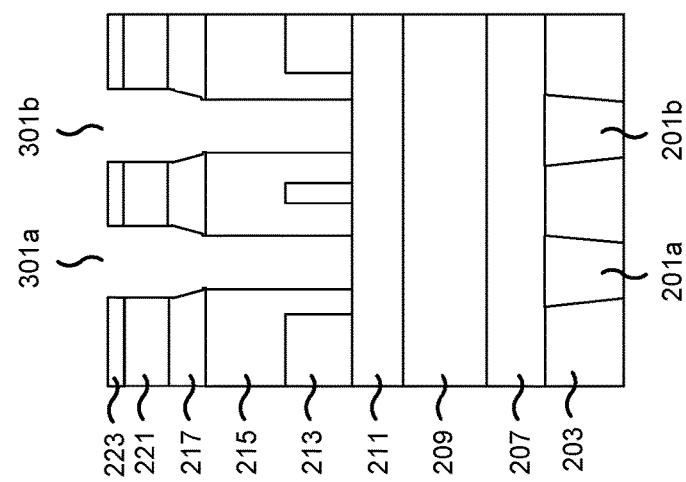

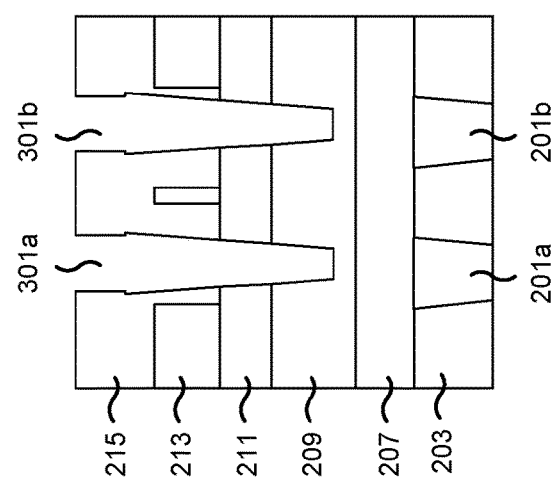

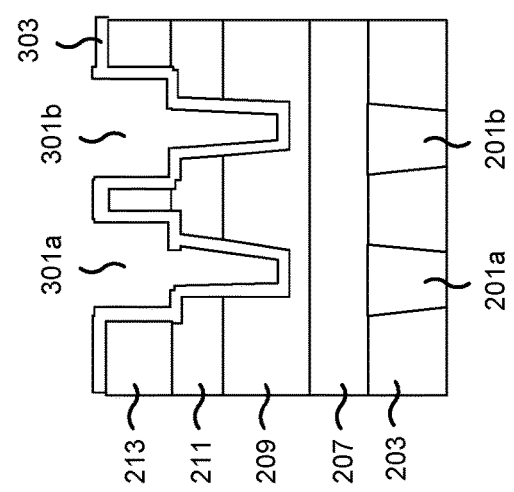

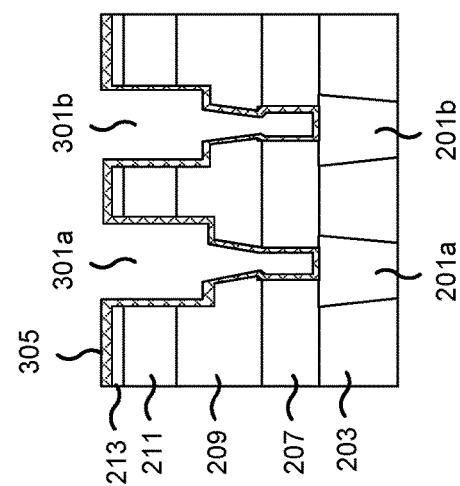

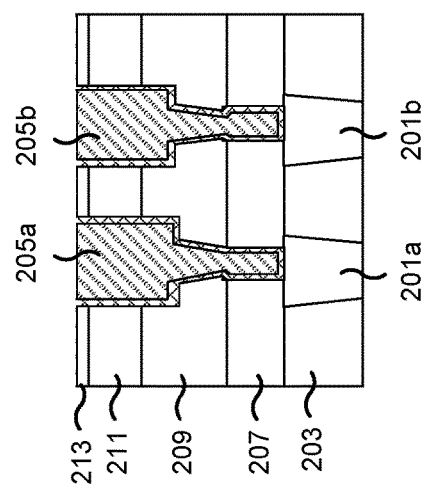

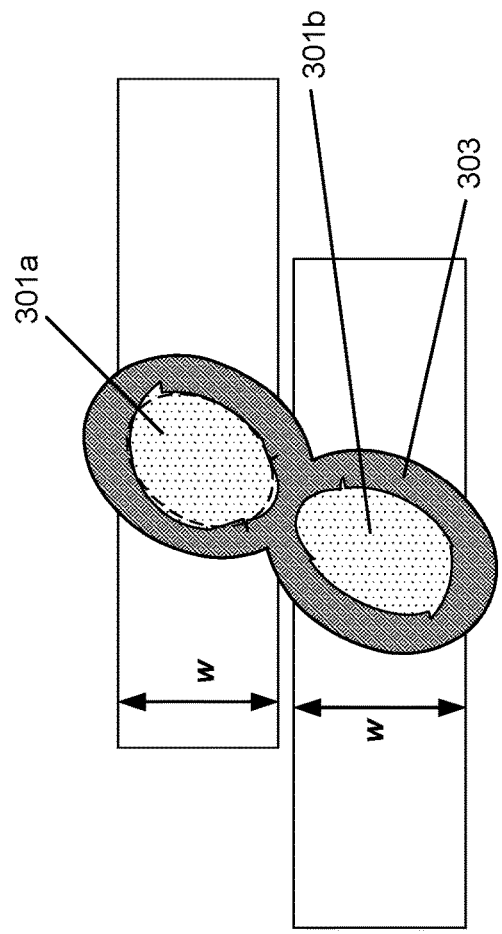

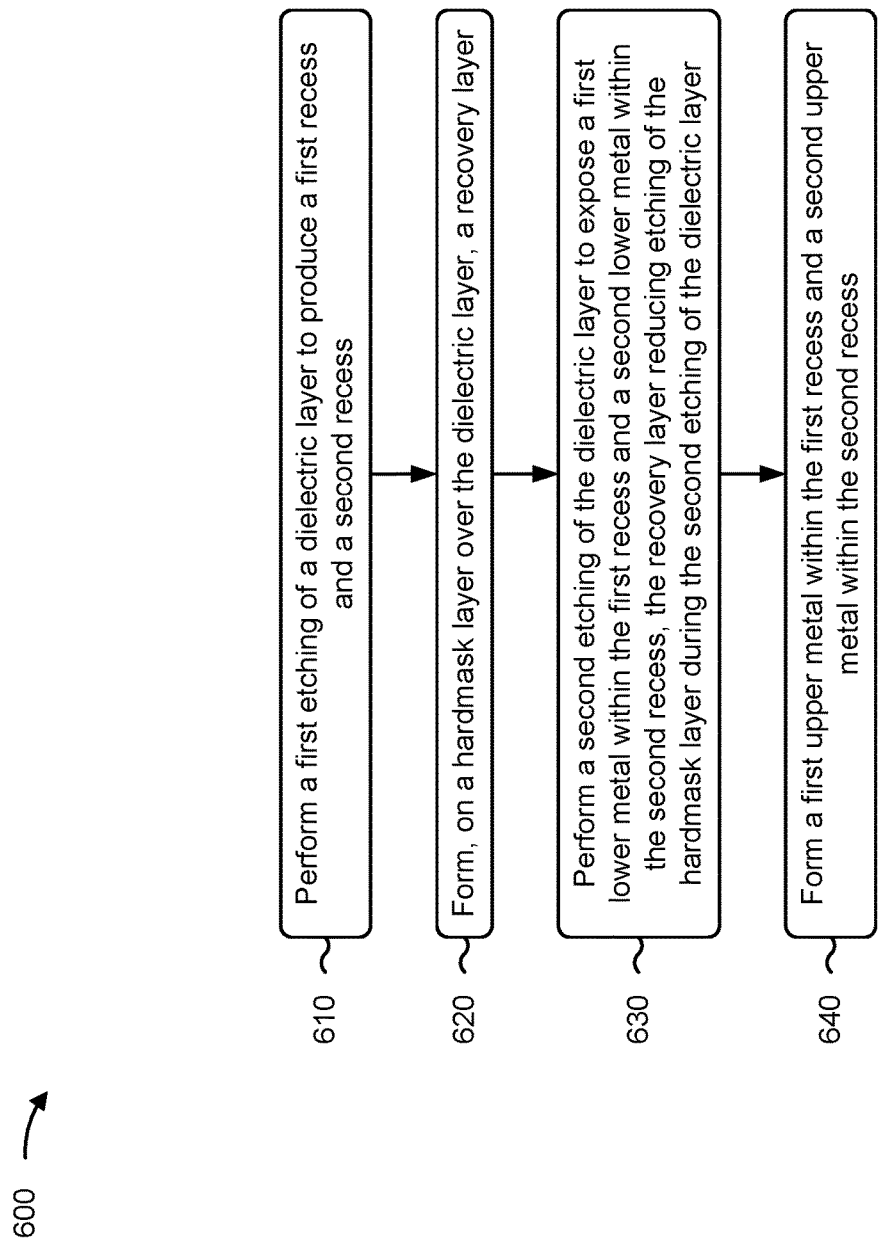

SEMICONDUCTOR STRUCTURE FORMATION

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3J are diagrams of an example implementation described herein.

FIGS. 4A-4C are diagrams of example via shapes described herein.

FIG. 6 is a flowchart of an example process associated with forming a semiconductor structure described herein.

DETAILED DESCRIPTION

Figure 1:
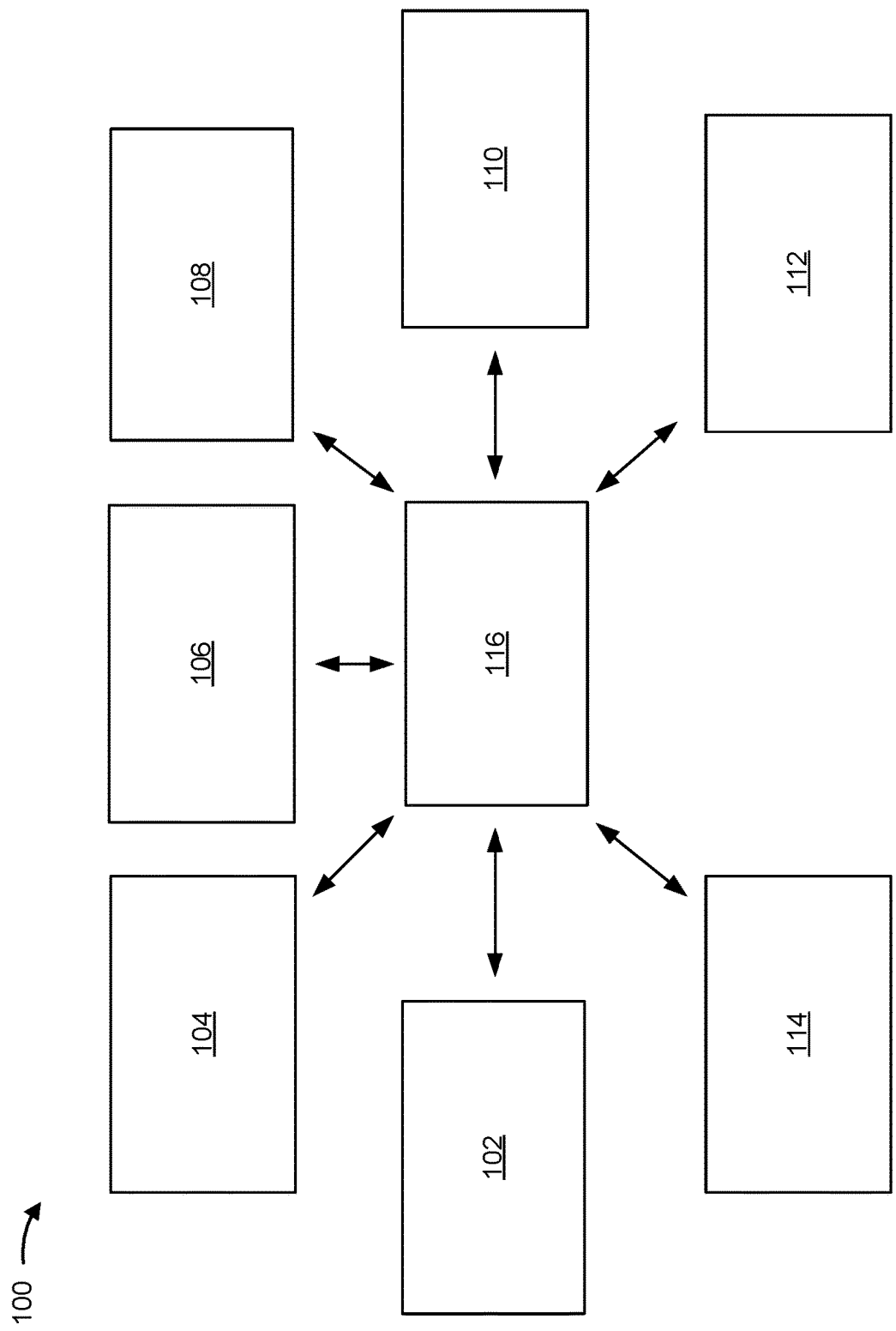
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Middle end of line (MEOL) contact plugs (also referred to as M0 interconnects or metallization layers) and back end of line (BEOL) metallization layers and vias (also referred to as M1, M2, M3, . . . , Mx interconnects or metallization layers, where x represents a positive integer) consume less power when decreased in size and use less wafer space when increased in density. One combined measure of size and density for MEOL and BEOL vias is pitch. Additionally, a top surface area of an MEOL and/or BEOL structure is generally larger than a corresponding bottom surface area in order to provide good contact with a back end (e.g., solder bumps and other lines on a wafer).

As pitch is decreased, MEOL and BEOL structures tend to bridge. For example, a hardmask material between recesses, in which adjacent MEOL or BEOL structures are formed, becomes prone to overetching such that upper surfaces of the adjacent MEOL or BEOL structures are not physically separated by the hardmask material. As a result, the adjacent MEOL or BEOL structures short-circuit and do not function properly.

Some implementations described herein provide techniques and apparatuses for forming a layer of organic and/or tin-based material within recesses, in which adjacent MEOL or BEOL structures are formed, after plasma ashing and before a trimming process. The layer of organic and/or tin-based material preserves hardmask material and dielectric material such that upper surfaces of the adjacent MEOL or BEOL structures remain physically separated. As a result, the adjacent MEOL or BEOL structures remain electrically isolated and function properly.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may include a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The photoresist removal tool 114 is a semiconductor processing tool that is capable of removing photoresist material. In some implementations, the photoresist removal tool 114 includes a chamber that is filled with a chemical stripper, and the substrate is placed in the chamber for a particular time period to remove particular amounts of one or more portions of the photoresist material. Alternatively, the photoresist removal tool 114 may inject the chemical stripper onto the substrate. In some implementations, the photoresist removal tool 114 etches one or more portions of the substrate using plasma ashing, which may involve using a monatomic gas to remove the photoresist material.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
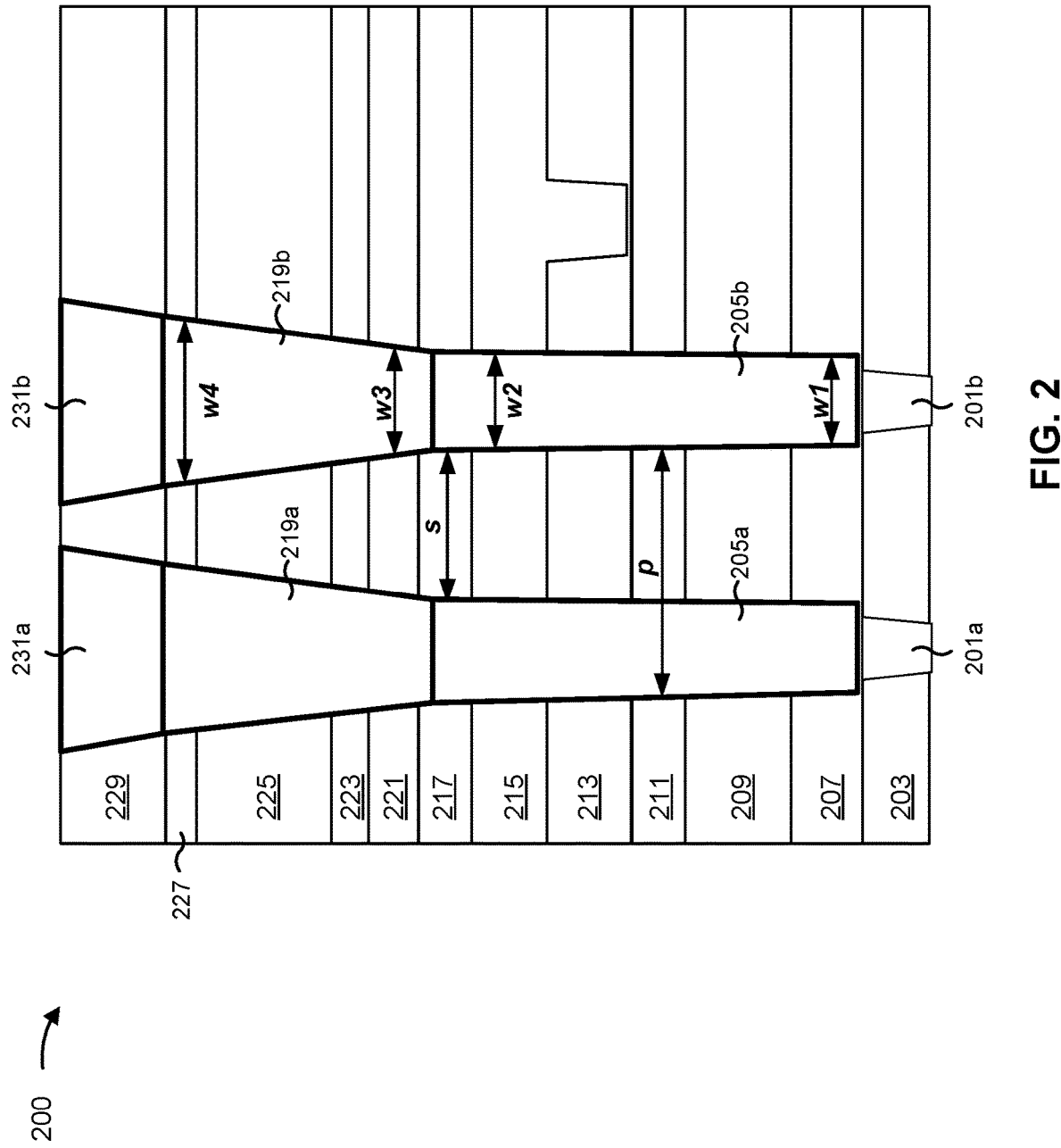
FIG. 2 is a diagram of an example semiconductor structure described herein.

FIG. 2 is a diagram of a portion of an example device 200 described herein. Device 200 includes an example of a memory device, a logic device, a processor, an input/output device, and/or another type of semiconductor device that includes a BEOL connecting to a front end of line (FEOL), with one or more transistors, via an MEOL with one or more contacts.

The device 200 may be formed above a substrate and an active layer. In example 200, the device 200 includes a BEOL with at least BEOL conductive structures 201a and 201b (e.g., M3 metallization layers or vias). The device 200 further includes one or more stacked layers, including a dielectric layer 203 with the adjacent lower BEOL conductive structures 201a and 201b connected to upper BEOL conductive structures 205a and 205b, respectively. Additionally, the device 200 may include an etch stop layer (ESL) 207, a dielectric layer 209, an inter-layer dielectric (ILD) 211, a hardmask 213, a blocking layer 215, and a low temperature oxide (LTO) layer 217, among other examples. The upper BEOL conductive structures 205a and 205b may connect to higher metallization layers, such as conductive structures 219a and 219b, respectively. Additionally, the device 200 may include a dummy middle layer (dML) 221, an oxide layer 223, a blocking layer 225, a middle layer (ML) 227, and a photoresist (PR) layer 229, among other examples. The higher metallization layers 219a and 219b may further connect to higher metallization layers, such as conductive structures 231a and 231b, respectively.

The dielectric layers 203 and 209 are included to electrically isolate various structures of the device 200. The dielectric layers 203 and 209 may each include a silicon nitride (SiN$_x$), an oxide (e.g., a silicon oxide (SiO$_x$) and/or another oxide material), and/or another type of dielectric material. The ESL 207 includes a layer of material that is configured to permit various portions of the device 200 (or the layers included therein) to be selectively etched or protected from etching to form one or more of the structures included in the device 200. For example, the ESL 207 may include silicon nitride (SiN$_x$), an oxide (e.g., a silicon oxide (SiO$_x$)), silicon oxynitride (SiO$_x$N$_x$) metal oxide, and/or metal oxynitride.

The ILD 211 is included to electrically isolate various structures of the device 200. The ILD 211 may include silica (SiO$_2$), hafnium silicate (HfSiO$_4$), zirconium silicate (ZrSiO$_4$), a tetra-ethyl-ortho-silicate (TEOS), and/or another type of dielectric material. The hardmask 213 is included to allow for lithographic formation of recesses (e.g., recesses 301a and 301b as shown in FIGS. 3A-3J) in which the upper BEOL conductive structures 205a and 205b are formed. The hardmask 213 may include silicon nitride (SiN), silicon oxynitride (SiON), titanium nitride (TiN), and/or another type of hardmask material.

The blocking layers 215 and 225 are included to protect layers below the blocking layers 215 and 225, respectively, during etching processes. For example, the blocking layer 215 may protect the hardmask 213 during etching, and the block layer 225 may protect the oxide layer 223 during etching. The blocking layers 215 and 225 may each include silicon nitride (SiN$_x$), an oxide (e.g., a silicon oxide (SiO$_x$)), silicon oxynitride (SiO$_x$N$_x$) metal oxide, and/or metal oxynitride.

The LTO layer 217 is included to protect blocking layer 215 during etching processes. The LTO layer 217 may include an oxide (e.g., a silicon oxide (SiO$_x$)) deposited using CVD at a temperature no more than approximately 500° C. The dML 221 and the ML 227 are included to provide anti-reflective properties during lithography processes. The dML 221 and the ML 227 may each include silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or another anti-reflective material. The PR 229 is included to allow for lithography formation of recesses in which the conductive structures 231a and 231b are formed. The PR 229 may include a positive photoresist or negative photoresist material.

The conductive structures 201a, 201b, 205a, 205b, 219a, 219b, 231a, and 231b each includes a conductive material such as tungsten (W), cobalt (Co), ruthenium (Ru), copper (Cu), gold (Au), and/or another type of conductive metal. The conductive structures 231a and 231b connect the device 200 to a back end (e.g., solder bumps and other lines on a wafer including the device 200). In some implementations, the BEOL layers of the device 200 include additional metallization layers and/or vias that connect the conductive structures 231a and 231b to the back end.

As further shown in FIG. 2, each of the BEOL conductive structures 205a and 205b may have a width (e.g., represented by w1) associated with lower surfaces of the BEOL conductive structures 205a and 205b (e.g., at interfaces with the BEOL conductive structures 201a and 201b, respectively, or near the interfaces, such as within a few nanometers (nm) of the interfaces). The width w1 may be no more than approximately 16 nm. By selecting a width of no more than approximately 16 nm, power consumption of the BEOL conductive structures 205a and 205b is reduced, and an area on the wafer occupied by the BEOL conductive structures 205a and 205b is reduced. Additionally, each of the BEOL conductive structures 205a and 205b may have a width (e.g., represented by w2) associated with upper surfaces of the BEOL conductive structures 205a and 205b (e.g., at interfaces with the BEOL conductive structures 219a and 219b, respectively, or near the interfaces, such as within a few nm of the interfaces). The width w2 may be larger than the width w1 such that the conductive structures 205a and 205b have a larger surface area at the interfaces with the BEOL conductive structures 219a and 219b, respectively, as compared with the interfaces with the BEOL conductive structures 201a and 201b, respectively. Additionally, the width w2 may be no more than approximately 21 nm. By selecting a width larger than w1, electrical resistances of the conductive structures 205a and 205b are reduced. By selecting a width no more than approximately 21 nm, power consumption of the BEOL conductive structures 205a and 205b is reduced, and an area on the wafer occupied by the BEOL conductive structures 205a and 205b is reduced.

Similarly, each of the BEOL conductive structures 219a and 219b may have a width (e.g., represented by w3) associated with lower surfaces of the BEOL conductive structures 219a and 219b (e.g., at interfaces with the BEOL conductive structures 205a and 205b, respectively, or near the interfaces, such as within a few nm of the interfaces). The width w3 may be no more than approximately 29 nm. By selecting a width of no more than approximately 29 nm, power consumption of the BEOL conductive structures 219a and 219b is reduced, and an area on the wafer occupied by the BEOL conductive structures 219a and 219b is reduced. Additionally, each of the BEOL conductive structures 219a and 219b may have a width (e.g., represented by w4) associated with upper surfaces of the BEOL conductive structures 219a and 219b (e.g., at interfaces with the BEOL conductive structures 231a and 231b, respectively, or near the interfaces, such as within a few nm of the interfaces). The width w4 may be larger than the width w3 such that the conductive structures 219a and 219b have a larger surface area at the interfaces with the BEOL conductive structures 231a and 231b, respectively, as compared with the interfaces with the BEOL conductive structures 205a and 205b, respectively. Additionally, the width w4 may be no more than approximately 53 nm. By selecting a width larger than w3, electrical resistances of the conductive structures 219a and 219b are reduced. By selecting a width no more than approximately 53 nm, power consumption of the BEOL conductive structures 219a and 219b is reduced, and an area on the wafer occupied by the BEOL conductive structures 219a and 219b is reduced.

As further shown in FIG. 2, the conductive structures 205a and 205b are physically separated by a spacing (e.g., represented by s). The spacing associated with upper surfaces of the BEOL conductive structures 205a and 205b (e.g., at interfaces with the BEOL conductive structures 219a and 219b, respectively, or near the interfaces, such as within a few nm of the interfaces) may be no more than approximately 21 nm. By selecting a spacing of no more than approximately 21 nm, an area on the wafer occupied by the BEOL conductive structures 205a and 205b is reduced.

Additionally, the conductive structures 205a and 205b are associated with a pitch (e.g., represented by p). The pitch represents a distance from a central point of the conductive structure 205a to a corresponding central point of the conductive structure 205b. For example, the pitch may be calculated by summing a width of the conductive structure 205a (or a width of the conductive structure 205b) and a spacing between the conductive structures 205a and 205b.

Generally, the pitch is calculated at a midpoint (or within a few nm of the midpoint) between upper surfaces of the conductive structures 205a and 205b and lower surfaces of the conductive structures 205a and 205b.

The pitch of the conductive structures 205a and 205b may be no more than approximately 35 nm. By selecting a pitch of no more than approximately 35 nm, power consumption of the BEOL conductive structures 205a and 205b is reduced, and an area on the wafer occupied by the BEOL conductive structures 205a and 205b is reduced. In order to achieve a pitch of approximately 35 nm or less, the hardmask 213 should not be overetched. By depositing a recovery layer, as described in connection with FIGS. 3A-3J, a pitch of approximately 35 nm or less (as well as with one or more of the measurements described above) is achievable.

As indicated above, FIG. 2 is provided as an example. Other examples may differ from what is described with regard to FIG. 2.

FIGS. 3A-3J are diagrams of an example implementation 300 described herein. Example implementation 300 may be an example process for forming the conductive structures 205a and 205b over the conductive structures 201a and 201b, respectively. The conductive structures 205a and 205b are formed with a pitch of no more than approximately 35 nm, as described in connection with FIG. 2.

As shown in FIG. 3A, the example process for forming the conductive structures 205a and 205b may be performed in connection with a BEOL. In some implementations, the BEOL includes the conductive structures 201a and 201b (e.g., M3 metallization layers or vias) formed in the dielectric layer 203 that is below the ESL 207. Although described with respect to forming the conductive structures 205a and 205b over other BEOL conductive structures, the description similarly applies to forming the conductive structures 205a and 205b over MEOL conductive structures.

The ESL 207 may be formed over the dielectric layer 203 and the conductive structures 201a and 201b. The deposition tool 102 may deposit the ESL 207 using a CVD technique, a PVD technique, an ALD technique, or another type of deposition technique. The planarization tool 110 may planarize the ESL 207 after the ESL 207 is deposited. Although depicted as a single layer, the ESL 207 may comprise a multi-layer stack of different ESL materials.

The dielectric layer 209 may be formed over the ESL 207. For example, the deposition tool 102 may deposit the dielectric layer 209 using a CVD technique, a PVD technique, an ALD technique, or another type of deposition technique. The planarization tool 110 may planarize the dielectric layer 209 after the dielectric layer 209 is deposited.

The ILD 211 may be formed over the dielectric layer 209. For example, the deposition tool 102 may deposit the ILD 211 using a CVD technique, a PVD technique, an ALD technique, or another type of deposition technique. The planarization tool 110 may planarize the ILD 211 after the ILD 211 is deposited.

The hardmask 213 may be formed over the ILD 211. For example, the deposition tool 102 may deposit the hardmask 213 using a CVD technique, a PVD technique, an ALD technique, or another type of deposition technique. Additionally, the exposure tool 104 may expose the hardmask 213 to a radiation source to pattern the hardmask 213, and the developer tool 106 may develop and remove portions of the hardmask 213 to expose the pattern. Accordingly, as shown in FIG. 3A, the hardmask 213 may be discontinuous along the ILD 211.

The blocking layer 215 may be formed over the hardmask 213. For example, the deposition tool 102 may deposit the blocking layer 215 using a CVD technique, a PVD technique, an ALD technique, or another type of deposition technique. The planarization tool 110 may planarize the blocking layer 215 after the blocking layer 215 is deposited.

The LTO layer 217 may be formed over the blocking layer 215. For example, the deposition tool 102 may deposit the LTO layer 217 using a CVD technique, a PVD technique, an ALD technique, or another type of deposition technique. The LTO layer 217 is deposited at a temperature of no more than approximately 500° C. The planarization tool 110 may planarize the LTO layer 217 after the LTO layer 217 is deposited.

The dML 221 may be formed over the LTO layer 217. For example, the deposition tool 102 may deposit the dML 221 using a CVD technique, a PVD technique, an ALD technique, or another type of deposition technique. The planarization tool 110 may planarize the dML 221 after the dML 221 is deposited.

The oxide layer 223 may be formed over the dML 221. For example, the deposition tool 102 may deposit the oxide layer 223 using a CVD technique, a PVD technique, an ALD technique, or another type of deposition technique. The planarization tool 110 may planarize the oxide layer 223 after the oxide layer 223 is deposited.

As further shown in FIG. 3A, the oxide layer 223 may be etched to form openings (resulting in recesses 301a and 301b). For example, the deposition tool 102 may form a photoresist layer on the oxide layer 223, the exposure tool 104 may expose the photoresist layer to a radiation source to pattern the photoresist layer, the developer tool 106 may develop and remove portions of the photoresist layer to expose the pattern, and the etch tool 108 may etch portions of the oxide layer 223 to form the recesses 301a and 301b. In some implementations, the photoresist removal tool 114 removes the remaining portions of the photoresist layer (e.g., using a chemical stripper, a plasma asher, and/or another technique) after the etch tool 108 etches the recesses 301a and 301b. Additionally, the dML 221 may protect the LTO layer 217 during etching of the oxide layer 223 (e.g., using lithography, as described above). Accordingly, the etch tool 108 may further etch portions of the dML 221 (e.g., using dry etching and/or wet etching) to expose, at least in part, the LTO layer 217 within the recesses 301a and 301b.

As shown in FIG. 3B, the LTO layer 217 may be etched to increase sizes of the recesses 301a and 301b. For example, the etch tool 108 may etch portions of the LTO layer 217 using dry etching and/or wet etching. As a result, the blocking layer 215 is at least partially exposed within the recesses 301a and 301b.

As shown in FIG. 3C, the blocking layer 215 may be etched to increase sizes of the recesses 301a and 301b. The etch tool 108 may etch portions of the blocking layer 215 using a dual damascene process. For example, the deposition tool 102 may form a photoresist layer on the blocking layer 215, the exposure tool 104 may expose the photoresist layer to a radiation source to pattern the photoresist layer, the developer tool 106 may develop and remove portions of the photoresist layer to expose the pattern, and the etch tool 108 may etch portions of the blocking layer 215 to expand the recesses 301a and 301b. The deposition tool 102, the exposure tool 104, and the etch tool 108 may perform this process twice to expand the recesses 301a and 301b further. In some implementations, the photoresist removal tool 114 removes the remaining portions of the photoresist layer (e.g., using a chemical stripper, a plasma asher, and/or another technique)

after the etch tool 108 increases sizes of the recesses 301a and 301b. As a result, and because the hardmask 213 is discontinuous, the ILD 211 is at least partially exposed within the recesses 301a and 301b.

As shown in FIG. 3D, the ILD 211 and the dielectric layer 209 may be etched to increase sizes of the recesses 301a and 301b. The etch tool 108 may etch portions of the ILD 211 and the dielectric layer 209 using a dual damascene process. For example, the deposition tool 102 may form a photoresist layer on the blocking layer 215, the exposure tool 104 may expose the photoresist layer to a radiation source to pattern the photoresist layer, the developer tool 106 may develop and remove portions of the photoresist layer to expose the pattern, and the etch tool 108 may etch portions of the ILD 211 and the dielectric layer 209 to expand the recesses 301a and 301b. Accordingly, the etch tool 108 may use a lithographic or other photovoltaic process to etch the ILD 211 and the dielectric layer 209. Additionally, as shown in FIG. 3D, the LTO layer 217, the dML 221, and the oxide layer 223 may be etched as a consequence of the photovoltaic process.

Figure 3E:
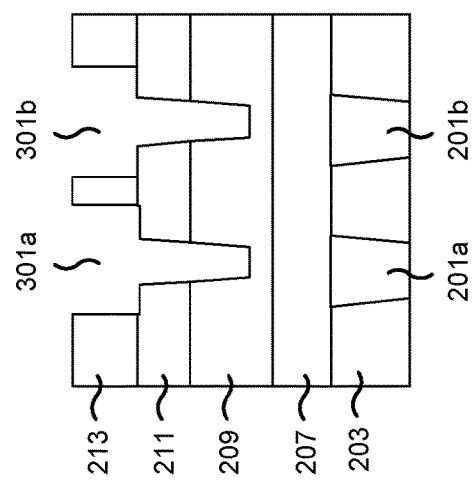

As shown in FIG. 3E, the blocking layer 215 may be etched to expose the hardmask 213. For example, the photoresist removal tool 114 may remove the blocking layer 215 (e.g., using a chemical stripper, a plasma asher, and/or another technique) in order to at least partially expose the hardmask 213.

As shown in FIG. 3F, a recovery layer 303 is formed over the hardmask 213 (and in the recesses 301a and 301b). The recovery layer 303 may comprise an organic material and/or a tin-based material. For example, the recovery layer 303 may comprise a polymer of a chemical form $C_xH_y$, a material including tin (Sn), or a combination of titanium fluoride (TiF) and a cyano group (CN⁻). The deposition tool 102 may deposit the recovery layer 303 using a CVD technique, a PVD technique, an ALD technique, or another type of deposition technique. For example, the deposition tool 102 may use a methane ($CH_4$) plasma, a nitrogen ($N_2$) plasma, a fluoroform ($CHF_3$) plasma, or a combination thereof to deposit the recovery layer 303. The recovery layer 303 prevents overetching of the hardmask 213, which prevents the conductive structures 205a and 205b from bridging (that is, failing to remain physically separate at upper surfaces of the conductive structures 205a and 205b).

Figure 3G:
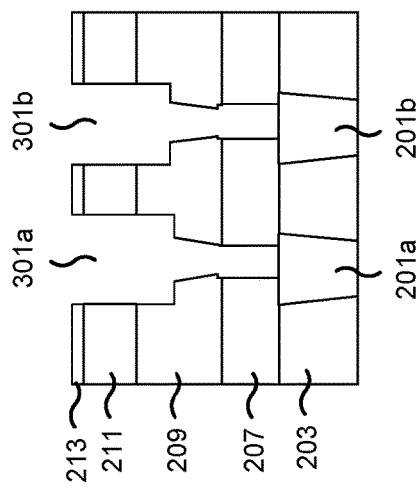

As shown in FIG. 3G, the dielectric layer 209 and the ESL 207 may be etched to increase sizes of the recesses 301a and 301b. For example, the etch tool 108 may perform a trimming process (e.g., a wet etch process and/or a dry etch process) to expose the ESL 207. Additionally, the trimming process removes all or most of the recovery layer 303. Accordingly, the recovery layer 303 prevents overetching of the hardmask 213. In some implementations, trace amounts of the recovery layer 303 remain on sidewalls of the recesses 301a and 301b. As used herein, "trace amounts" refer to amounts present on less than 50% of the surface area of the recesses 301a and 301b.

The etch tool 108 may further perform a liner removal process to expose the conductive structures 201a and 201b in the recesses 301a and 301b, respectively. For example, the etch tool 108 may perform a wet etch process and/or a dry etch process to expose the conductive structures 201a and 201b.

As shown in FIG. 3H, a barrier layer 305 may be formed over sidewalls of the recesses 301a and 301b (and optionally over the conductive structures 201a and 201b). The deposition tool 102 may deposit the barrier layer 305 by a CVD technique, a PVD technique, an ALD technique, or another type of deposition technique. Additionally, the barrier layer 305 may be deposited over the hardmask 213. In some implementations, the barrier layer 305 includes a nitride, such as tantalum nitride (TaN). Accordingly, the barrier layer 305 prevents diffusion of copper atoms from the conductive structures 205a and 205b.

Figure 3I:
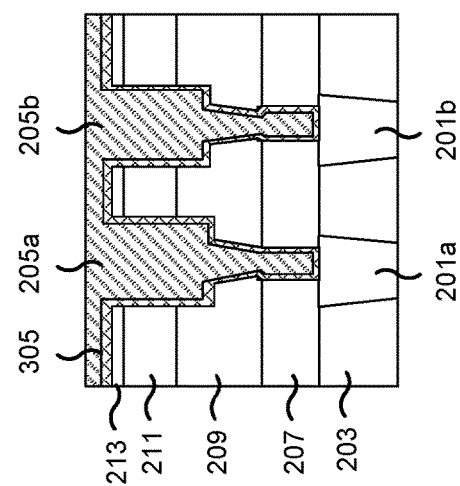

As shown in FIG. 3I, the conductive structures 205a and 205b may be formed in the recesses 301a and 301b, respectively, and over the barrier layer 305. The deposition tool 102 may deposit the copper of the conductive structures 205a and 205b using a CVD technique, a PVD technique, an ALD technique, or another type of deposition technique, the plating tool 112 may deposit the copper of the conductive structures 205a and 205b using an electroplating operation, or a combination thereof.

In some implementations, the copper flows over the hardmask 213 as well as into the recesses 301a and 301b. Accordingly, as shown in FIG. 3J, the conductive structures 205a and 205b may be planarized. For example, the planarization tool 110 may planarize the conductive structures 205a and 205b after the conductive structures 205a and 205b are deposited. Additionally, portions of the barrier layer 305 deposited over the hardmask 213 may be removed during planarization. In some implementations, the planarization tool 110 uses CMP to planarize the conductive structures 205a and 205b.

As indicated above, FIGS. 3A-3J are provided as an example. Other examples may differ from what is described with regard to FIGS. 3A-3J. For example, in some implementations, an additional liner material, such as cobalt and/or ruthenium, may be included. An additional liner of cobalt improves electromigration (EM) lifetime of the conductive structures 205a and 205b by further preventing copper atom migration. Additionally, or alternatively, an additional liner of ruthenium improves flow of copper into the recesses 301a and 301b during formation of the conductive structures 205a and 205b.

FIG. 4A illustrates an example semiconductor structure 400 described herein. FIG. 4A is a bottom-up view of the semiconductor structure 400, which includes recesses 301a and 301b, described in connection with FIGS. 3A-3J.

FIG. 4A illustrates the recesses 301a and 301b each having a width (e.g., represented by w). The width may be measured from any two points on opposite sides of the irregular shapes of the recesses 301a and 301b. The width w may be no more than approximately 16 nm, as described in connection with FIG. 2. Although shown as equal, the recesses 301a and 301b may have different widths (e.g., due to minor imperfections during one or more etching processes).

FIG. 4A further illustrates recovery layer 303 before etching. The recovery layer 303 does not form in a circular or elliptical shape but instead a droplet-like shape. As used herein, "droplet-like shape" refers to an irregular shape characterized by a bounding ellipse that is larger in area than the irregular shape in a range from approximately 1% to approximately 10%. Because the recovery layer 303 causes the recesses 301a and 301b to have droplet-like cross-sections, the conductive structures 205a and 205b formed in the recesses 301a and 301b similarly have droplet-like cross-sections.

Figure 4B:
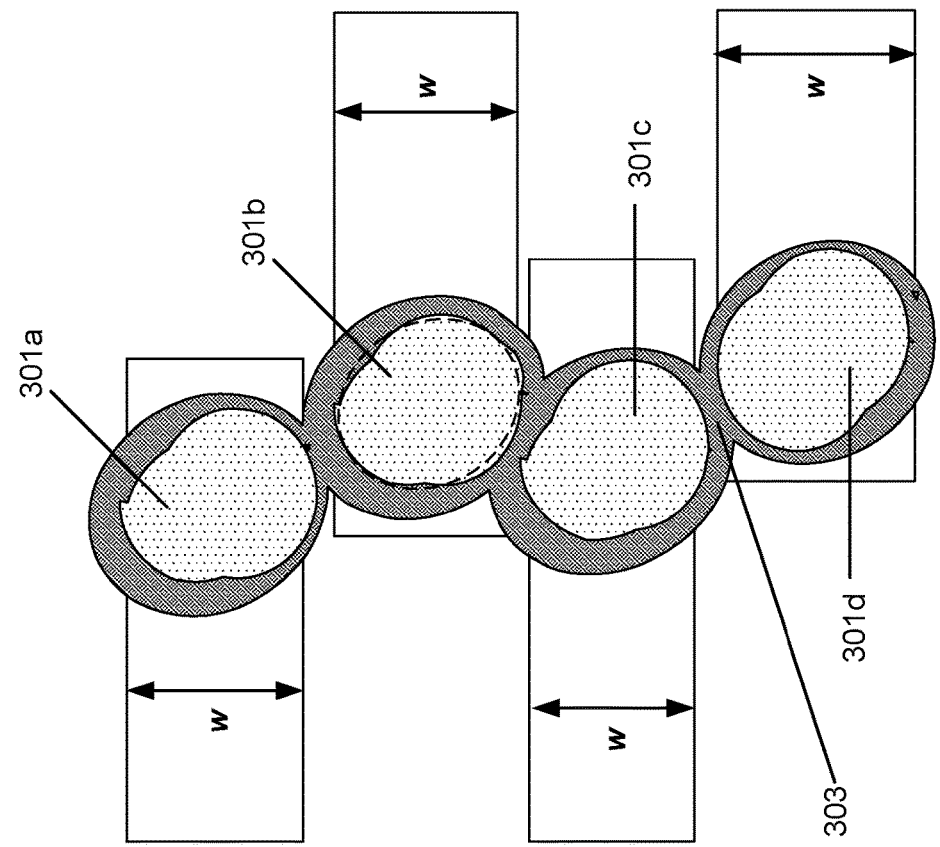

FIG. 4B illustrates an example semiconductor structure 410 described herein. FIG. 4B is a bottom-up view of the semiconductor structure 410, which is similar to semiconductor structure 400 of FIG. 4A but includes recesses 301a, 301b, 301c, and 301d.

FIG. 4B illustrates the recesses 301a, 301b, 301c, and 301d each having a width (e.g., represented by w). The width may be measured from any two points on opposite sides of the irregular shapes of the recesses 301a, 301b, 301c, and 301d. The width w may be no more than approximately 16 nm, as described in connection with FIG. 2. Although shown as equal, two or more of the recesses 301a, 301b, 301c, and 301d may have different widths (e.g., due to minor imperfections during one or more etching processes).

FIG. 4B further illustrates recovery layer 303 before etching. The recovery layer 303 does not form in a circular or elliptical shape but instead a droplet-like shape. Because the recovery layer 303 causes the recesses 301a, 301b, 301c, and 301d to have droplet-like cross-sections, conductive structures formed in the recesses 301a, 301b, 301c, and 301d will similarly have droplet-like cross-sections.

Figure 4C:
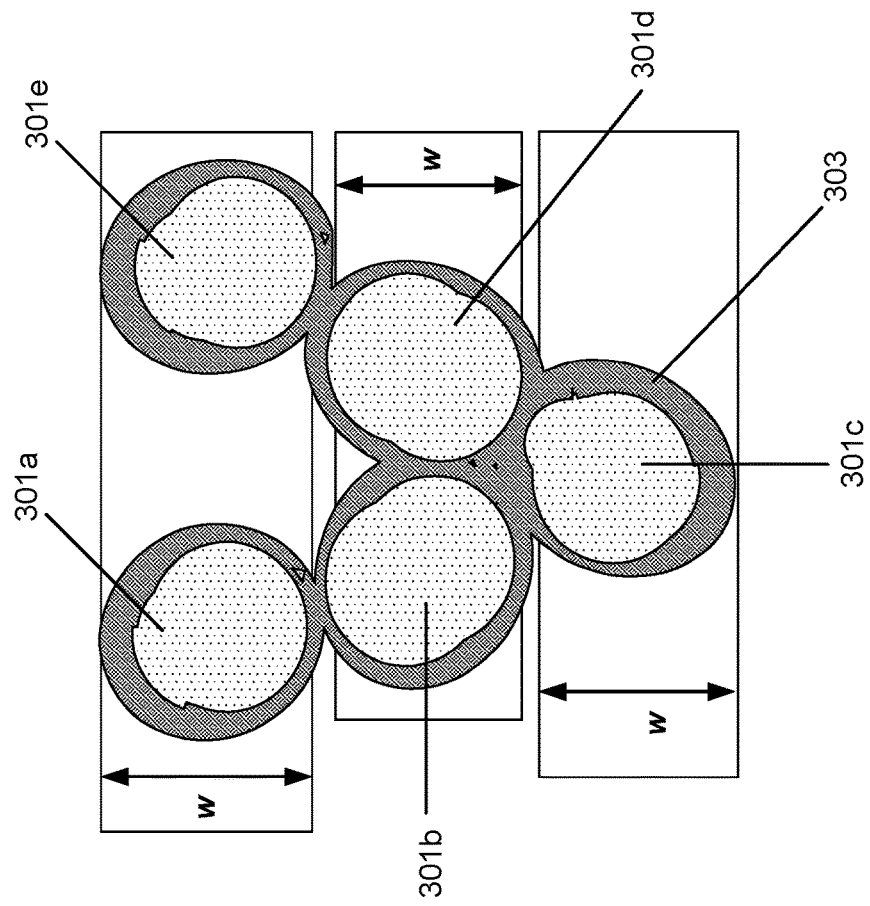

FIG. 4C illustrates an example semiconductor structure 420 described herein. FIG. 4C is a bottom-up view of the semiconductor structure 420, which is similar to semiconductor structure 400 of FIG. 4A but includes recesses 301a, 301b, 301c, 301d, and 301e.

FIG. 4C illustrates the recesses 301a, 301b, 301c, 301d, and 301e each having a width (e.g., represented by w). The width may be measured from any two points on opposite sides of the irregular shapes of the recesses 301a, 301b, 301c, 301d, and 301e. The width w may be no more than approximately 16 nm, as described in connection with FIG. 2. Although shown as equal, two or more of the recesses 301a, 301b, 301c, 301d, and 301e may have different widths (e.g., due to minor imperfections during one or more etching processes).

FIG. 4C further illustrates recovery layer 303 before etching. The recovery layer 303 does not form in a circular or elliptical shape but instead a droplet-like shape. Because the recovery layer 303 causes the recesses 301a, 301b, 301c, 301d, and 301e to have droplet-like cross-sections, conductive structures formed in the recesses 301a, 301b, 301c, 301d, and 301e will similarly have droplet-like cross-sections.

As indicated above, FIGS. 4A-4C are provided as examples. Other examples may differ from what is described with regard to FIGS. 4A-4C. For example, although described with clusters of two, four, or five recesses, other examples may include clusters with three, six, seven, or other quantities of recesses.

Figure 5:
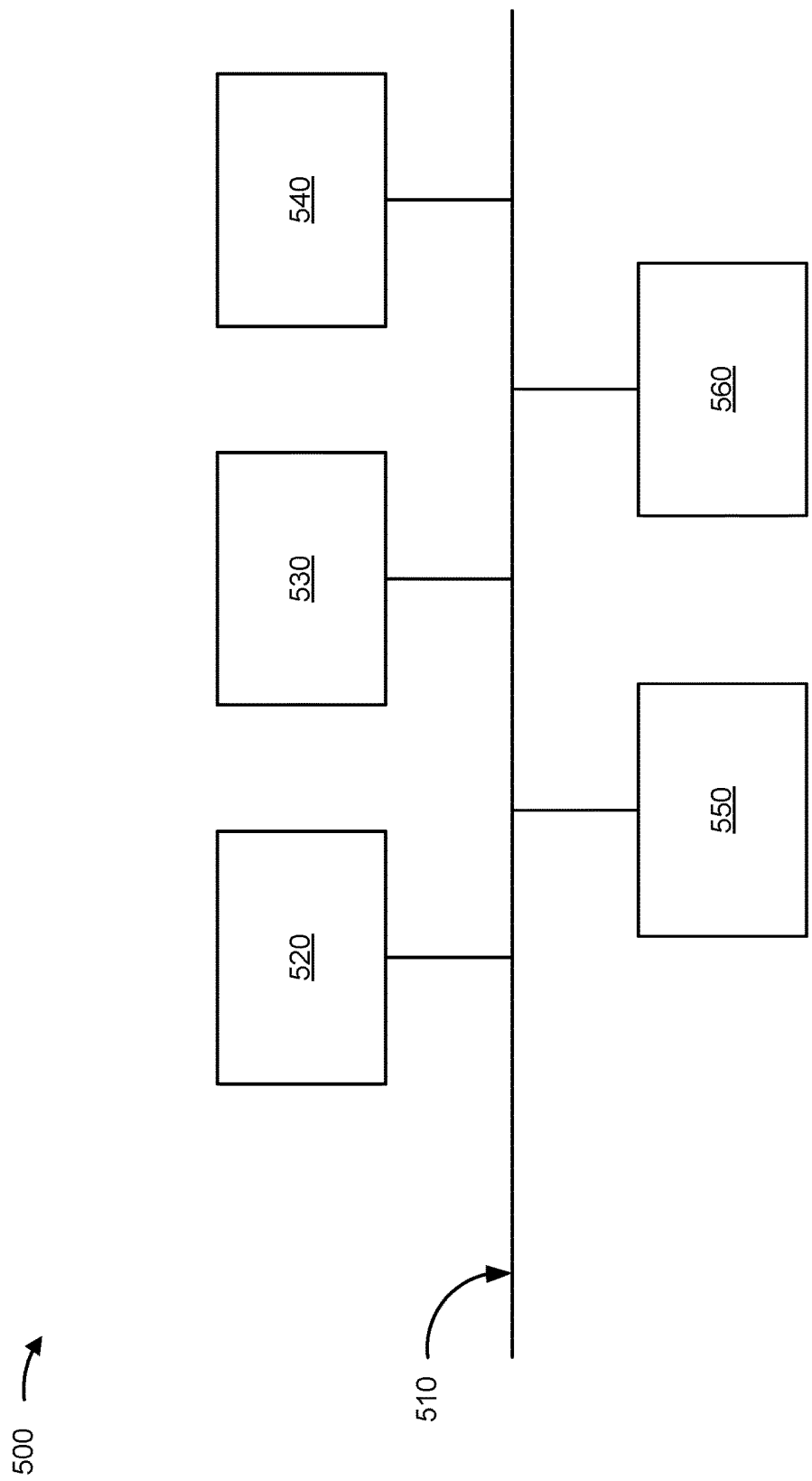
FIG. 5 is a diagram of example components of one or more devices of FIG. 1 described herein.

FIG. 5 is a diagram of example components of a device 500. In some implementations, one or more of the semiconductor processing tools 102-114 and/or the wafer/die transport tool 116 may include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

FIG. 6 is a flowchart of an example process 600 associated with semiconductor structure formation. In some implementations, one or more process blocks of FIG. 16 may be performed by one or more semiconductor processing tools (e.g., one or more of the semiconductor processing tools 102-114 and/or the wafer/die transport tool 116). Additionally, or alternatively, one or more process blocks of FIG. 6 may be performed by one or more components of device 500, such as processor 520, memory 530, input component 540, output component 550, and/or communication component 560.

As shown in FIG. 6, process 600 may include performing a first etching of a dielectric layer to produce a first recess and a second recess (block 610). For example, the one or more semiconductor processing tools 102-114 may perform a first etching of a dielectric layer 209 to produce a first recess 301*a* and a second recess 301*b*, as described herein.

As further shown in FIG. 6, process 600 may include forming, on a hardmask layer over the dielectric layer, a recovery layer (block 620). For example, the one or more semiconductor processing tools 102-114 may form, on a hardmask layer 213 over the dielectric layer 209, a recovery layer 303, as described herein.

As further shown in FIG. 6, process 600 may include performing a second etching of the dielectric layer to expose a first lower metal within the first recess and a second lower metal within the second recess (block 630). For example, the one or more semiconductor processing tools 102-114 may perform a second etching of the dielectric layer 209 to expose a first lower metal 201*a* within the first recess 301*a* and a second lower metal 201*b* within the second recess 301*b*, as described herein. The recovery layer 303 reduces etching of the hardmask layer 213 during the second etching of the dielectric layer 209.

As further shown in FIG. 6, process 600 may include forming a first upper metal within the first recess and a second upper metal within the second recess (block 640). For example, the one or more semiconductor processing tools 102-114 may form a first upper metal 205*a* within the first recess 301*a* and a second upper metal 205*b* within the second recess 301*b*, as described herein.

Process 600 may include additional implementations, such as any single implementation or any combination of implementations described below and/or in connection with one or more other processes described elsewhere herein.

In a first implementation, an upper portion of the first recess 301*a* is physically separated from an upper portion of the second recess 301*b* by a hardmask layer 213.

In a second implementation, alone or in combination with the first implementation, the recovery layer 303 comprises at least one of a polymer of a chemical form $C_xH_y$, a material including tin (Sn), or a combination of titanium fluoride (TiF) and a cyano group (CN⁻).

In a third implementation, alone or in combination with one or more of the first and second implementations, the first lower metal 201*a* comprises a first BEOL conductive structure 201*a*, and the second lower metal 201*b* comprises a second BEOL conductive structure 201*b*.

In a fourth implementation, alone or in combination with one or more of the first through third implementations, the first upper metal 205*a* comprises a first conductive structure 205*a*, and the second upper metal 205*b* comprises a second conductive structure 205*b*.

In a fifth implementation, alone or in combination with one or more of the first through fourth implementations, the first lower metal 201*a*, the second lower metal 201*b*, the first upper metal 205*a*, and the second upper metal 205*b* each comprises copper.

In a sixth implementation, alone or in combination with one or more of the first through fifth implementations, the first upper metal 205*a* and the second upper metal 205*b* have a pitch of no more than 35 nm.

In a seventh implementation, alone or in combination with one or more of the first through sixth implementations, a top surface of the first upper metal 205*a* and a top surface of the second upper metal 205*b* are physically separated by no more than 21 nm.

In an eighth implementation, alone or in combination with one or more of the first through seventh implementations, performing the first etching of the dielectric layer 209 to produce the first recess 301*a* and the second recess 301*b* comprises performing a photovoltaic process to etch the dielectric layer 209 and performing a plasma ashing to remove a blocking layer 215 over the hardmask layer 213. Additionally, in some implementations, process 600 may further include etching an LTO layer 217 to expose the blocking layer 215 and performing a dual damascene process to expose an ILD 211 over the dielectric layer 209. For example, the ILD 211 may comprise a TEOS.

In a ninth implementation, alone or in combination with one or more of the first through eighth implementations, the hardmask layer comprises titanium nitride (TiN).

In a tenth implementation, alone or in combination with one or more of the first through ninth implementations, performing the second etching of the dielectric layer 209 to expose the first lower metal 201*a* and the second lower metal 201*b* comprises performing a trimming process to expose at least one ESL 207 above the first lower metal 201*a* and the second lower metal 201*b* and performing a liner removal process to expose the first lower metal 201*a* and the second lower metal 201*b*.

In an eleventh implementation, alone or in combination with one or more of the first through tenth implementations, forming the recovery layer comprises depositing recovery layer using a methane ($CH_4$) plasma, a nitrogen ($N_2$) plasma, a fluoroform ($CHF_3$) plasma, or a combination thereof.

In a twelfth implementation, alone or in combination with one or more of the first through eleventh implementations, forming the first upper metal 205*a* and the second upper metal 205*b* comprises depositing copper into the first recess 301*a*, into the second recess 301*b*, and over the hardmask layer 213 and removing excess copper over the hardmask layer 213 using CMP. Additionally, in some implementations, process 600 further includes forming a barrier layer 305 above the copper such that a portion of the barrier layer 305 is removed using the CMP. For example, the barrier layer 305 may comprise tantalum nitride (TaN).

Although FIG. 6 shows example blocks of process 600, in some implementations, process 600 includes additional blocks, fewer blocks, different blocks, or differently arranged blocks than those depicted in FIG. 6. Additionally, or alternatively, two or more of the blocks of process 600 may be performed in parallel.

In this way, a recovery layer (e.g., a layer of organic and/or tin-based material) is formed within recesses, in which adjacent MEOL or BEOL structures are formed, after plasma ashing and before a trimming process. The recovery layer preserves hardmask material and dielectric material such that upper surfaces of the adjacent MEOL or BEOL structures remain physically separated. As a result, the adjacent MEOL or BEOL remain electrically isolated and functional.

As described in greater detail above, some implementations described herein provide a method. The method includes performing a first etching of a dielectric layer to produce a first recess and a second recess, wherein an upper portion of the first recess is physically separated from an upper portion of the second recess by a hardmask layer. The method includes forming, on the hardmask layer, a recovery layer comprising at least one of a polymer of a chemical form $C_xH_y$, a material including tin (Sn), or a combination of titanium fluoride (TiF) and a cyano group (CN⁻). The method includes performing a second etching of the dielectric layer to expose a first back end of line (BEOL) conductive structure within the first recess and a second BEOL conductive structure within the second recess, wherein the recovery layer reduces etching of the hardmask layer during the second etching of the dielectric layer. The method includes forming a first conductive structure within the first recess and a second conductive structure within the second recess.

As described in greater detail above, some implementations described herein provide a method. The method includes performing a first etching of a dielectric layer to produce a first recess and a second recess. The method includes forming, on a hardmask layer over the dielectric layer, a recovery layer. The method includes performing a second etching of the dielectric layer to expose a first lower metal within the first recess and a second lower metal within the second recess, wherein the recovery layer reduces etching of the hardmask layer during the second etching of the dielectric layer. The method includes forming a first upper metal within the first recess and a second upper metal within the second recess.

As described in greater detail above, some implementations described herein provide a semiconductor structure. The semiconductor structure includes a first via electrically connecting a first back end of line (BEOL) conductive structure to a front end of line (FEOL). The semiconductor structure includes a second via electrically connecting a second BEOL conductive structure to the FEOL, where the first via and the second via have a pitch of no more than 35 nanometers (nm), and the first via and the second via are electrically isolated by at least one hardmask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    performing a first etching of a dielectric layer to produce a first recess and a second recess, wherein at least one the first recess or the second recess comprises an upper portion and a lower portion having a width less than a width of the upper portion, wherein the upper portion of the first recess is physically separated from the upper portion of the second recess by a hardmask layer;
    forming, on the hardmask layer, a recovery layer comprising at least one of a polymer of a chemical form $C_xH_y$, a material including tin (Sn), or a combination of titanium fluoride (TiF) and a cyano group ($CN^-$);
    performing a second etching of the dielectric layer to expose a first back end of line (BEOL) conductive structure within the first recess and a second BEOL conductive structure within the second recess, wherein the recovery layer reduces etching of the hardmask layer during the second etching of the dielectric layer; and
    forming a first conductive structure within the first recess and a second conductive structure within the second recess.

2. The method of claim 1, wherein performing the first etching of the dielectric layer to produce the first recess and the second recess comprises:
    etching the dielectric layer; and
    performing a plasma ashing to remove a blocking layer over the hardmask layer.

3. The method of claim 2, further comprising:
    etching a low temperature oxide (LTO) layer to expose the blocking layer; and
    performing a dual damascene process to expose an interlayer dielectric (ILD) over the dielectric layer.

4. The method of claim 3, wherein the ILD comprises a tetra-ethyl-ortho-silicate (TEOS).

5. The method of claim 1, wherein the hardmask layer comprises titanium nitride (TiN).

6. The method of claim 1, wherein performing the second etching of the dielectric layer to expose the first BEOL conductive structure and the second BEOL conductive structure comprises:
    performing a trimming process to expose at least one etch stop layer (ESL) above the first BEOL conductive structure and the second BEOL conductive structure; and
    performing a liner removal process to expose the first BEOL conductive structure and the second BEOL conductive structure.

7. The method of claim 1, wherein forming the recovery layer comprises:
    depositing the recovery layer using a methane ($CH_4$) plasma, a nitrogen ($N_2$) plasma, a fluoroform ($CHF_3$) plasma, or a combination thereof.

8. The method of claim 1, wherein forming the first conductive structure and the second conductive structure comprises:
    depositing copper into the first recess, into the second recess, and over the hardmask layer; and
    removing excess copper over the hardmask layer using chemical mechanical polishing (CMP).

9. The method of claim 8, further comprising:
    forming a barrier layer above the copper,
        wherein a portion of the barrier layer is removed using the CMP.

10. The method of claim 9, wherein the barrier layer comprises tantalum nitride (TaN).

11. A method, comprising:
    performing a first etching of a first dielectric layer to produce a first recess and a second recess, wherein the first recess is a distance away from a first conductive structure in a second dielectric layer, wherein the second recess is a distance away from a second conductive structure in the second dielectric layer, wherein the first conductive structure is separate from the second conductive structure;
    forming, on a hardmask layer over the first dielectric layer, a recovery layer;
    performing a second etching of the first dielectric layer to expose a first lower metal within the first recess and a second lower metal within the second recess, wherein the recovery layer reduces etching of the hardmask layer during the second etching of the first dielectric layer; and
    forming a first upper metal within the first recess and a second upper metal within the second recess.

12. The method of claim 11, wherein the first lower metal, the second lower metal, the first upper metal, and the second upper metal each comprises copper.

13. The method of claim 11, wherein the first upper metal and the second upper metal have a pitch of no more than 35 nanometers (nm).

14. The method of claim 11, wherein a top surface of the first upper metal and a top surface of the second upper metal are physically separated by no more than 21 nanometers (nm).

15. A method, comprising:
forming a plurality of recesses, in a first dielectric layer, including a first recess and a second recess, wherein the first recess is a distance away from a first conductive structure in a second dielectric layer, wherein the second recess is a distance away from a second conductive structure in the second dielectric layer, wherein the first conductive structure is separate from the second conductive structure;
forming a recovery layer in the plurality of recesses;
exposing, via the recovery layer and the plurality of recesses, a plurality of conductive structures residing under the recovery layer and the plurality of recesses; and
forming the plurality of conductive structures in the plurality of recesses.

16. The method of claim 15, wherein the plurality of conductive structures are a plurality of back end of line (BEOL) conductive structures.

17. The method of claim 15, wherein the recovery layer is formed on a hardmask layer over the first dielectric layer.

18. The method of claim 17, wherein the hardmask layer comprises titanium nitride (TiN).

* * * * *